United States Patent
Pierson et al.

[11] Patent Number: 5,818,107
[45] Date of Patent: Oct. 6, 1998

[54] CHIP STACKING BY EDGE METALLIZATION

[75] Inventors: Mark Vincent Pierson, Binghamton; Thurston Bryce Youngs, Jr., Vestal, both of N.Y.

[73] Assignee: International Business Machines Corporation, Armonk, N.Y.

[21] Appl. No.: 785,187

[22] Filed: Jan. 17, 1997

[51] Int. Cl.⁶ .................................................. H01L 23/10
[52] U.S. Cl. .................... 257/723; 257/686; 257/777; 257/718; 257/720
[58] Field of Search ..................... 257/686, 666, 257/723, 675, 685, 692, 712, 713, 718, 720, 777

[56] References Cited

U.S. PATENT DOCUMENTS

| | | |
|---|---|---|
| 4,266,282 | 5/1981 | Henle et al. . |
| 4,551,629 | 11/1985 | Carson et al. . |
| 4,706,166 | 11/1987 | Go . |
| 4,922,378 | 5/1990 | Malhi et al. . |
| 4,980,002 | 12/1990 | Dzarnoski, Jr. et al. . |
| 4,983,533 | 1/1991 | Go . |
| 4,992,908 | 2/1991 | Solomon . |
| 4,999,311 | 3/1991 | Dzarnoski, Jr. et al. . |
| 5,025,306 | 6/1991 | Johnson et al. . |
| 5,031,072 | 7/1991 | Malhi et al. . |
| 5,075,253 | 12/1991 | Sliwa, Jr. . |
| 5,104,820 | 4/1992 | Go et al. . |
| 5,113,315 | 5/1992 | Wheeler et al. . |
| 5,146,308 | 9/1992 | Chance et al. . |
| 5,229,916 | 7/1993 | Frankeny et al. . |
| 5,239,199 | 8/1993 | Chiu . |
| 5,266,833 | 11/1993 | Capps . |
| 5,279,991 | 1/1994 | Minahan et al. . |
| 5,281,852 | 1/1994 | Normington ............................ 257/685 |
| 5,313,096 | 5/1994 | Eide ........................................ 257/686 |
| 5,327,327 | 7/1994 | Frew et al. . |
| 5,347,428 | 9/1994 | Carson et al. . |
| 5,356,838 | 10/1994 | Kim . |
| 5,362,986 | 11/1994 | Angiulli et al. . |
| 5,380,681 | 1/1995 | Hsu . |
| 5,397,747 | 3/1995 | Angiulli et al. . |
| 5,424,920 | 6/1995 | Miyake . |
| 5,426,563 | 6/1995 | Moresco et al. . |
| 5,426,566 | 6/1995 | Beilstein, Jr. et al. . |
| 5,455,455 | 10/1995 | Badehi . |
| 5,455,740 | 10/1995 | Burns . |
| 5,478,781 | 12/1995 | Bertin et al. . |
| 5,502,667 | 3/1996 | Bertin et al. . |
| 5,602,420 | 2/1997 | Ogata et al. ............................ 257/686 |

OTHER PUBLICATIONS

"Edge–Mounted Chip Assembly For Microprocessors"; IBM Technical Disclosure Bulletin, vol. 23, No. 2, Jul. 1980; H.I. Stoller; pp. 581 and 582.

*Primary Examiner*—Carl W. Whitehead, Jr.
*Attorney, Agent, or Firm*—Whitham, Curtis & Whitham

[57] ABSTRACT

An integrated circuit package derives increased mechanical robustness and electrical reliability consistent with increased heat dissipation capacity by bonding of integrated circuit chips into a chip stack and bonding the chip stack onto a substrate such as a chip, board, module or another integrated circuit by forming a solder or conductive adhesive bond between a bonding/contact pad on the substrate and a metallization feature extending at least on limited opposing areas of major surfaces of the chip and across the edge of the chip. Thickness of the metallization feature and bonding material provides a "stand-off" between chips allowing improved heat dissipation by fluid flow, conduction through a viscous thermally conducting material and/or a heat sink disposed between chips in the stack. Novel techniques of forming a metallization feature across the edge of a chip with high efficiency and manufacturing yield includes enclosure of chips or strips of chips in a tool including a grooved mask or enclosing the chips or strips of chips in a resist which may be exposed and developed using at least a portion of the same tool. An application provides a package including heat sinking of a microprocessor master chip in combination with stack of slave chips as memory, logic macros, cross-bar switches and the like which may also include heat sinks between chips in each chip stack.

19 Claims, 4 Drawing Sheets

CHIP STACKING BY EDGE METALLIZATION

BACKGROUND OF THE INVENTION

Field of the Invention

The present invention generally relates to packaging of electronic circuits and, more particularly, to the stacking of integrated circuit chips at high density and with reduced chip interconnection length.

Description of the Prior Art

It has been recognized that substantial performance gains as well as manufacturing economies can be achieved from high integration density of electronic circuits. Short signal paths reduce signal propagation time and are less susceptible to effects of noise as well as presenting reduced resistance and capacitance to be driven by individual active circuits therein. Manufacturing economies derive from the reduced number of chips or wafers which must be subjected to lengthy and complex processes requiring expensive and specialized equipment in order to form the desired circuits.

Accordingly, technologies have been developed which provide good manufacturing yields of integrated circuits using design rules providing minimum feature size of only a fraction of a micron, allowing millions of circuit elements to be formed on a single chip. Some techniques such as sidewall image transfer (STI) allow the formation of structures which are smaller than the limit of lithographic resolution and further increases in integration density are foreseeable. However, as the number of circuit elements on a single chip is increased, manufacturing yield may be compromised and a trade-off between integration density (with commensurate performance gains and economy per chip) and overall economy of manufacture is unavoidable.

There are several other practical limitations on the amount of circuitry which may be included on a single chip, as well. First, there is a practical limit on chip size since a chip will usually be subjected to mechanical stresses from both accelerations and thermal cycling in normal use. Since semiconductor substrates are somewhat delicate, increased chip dimensions correlate with increased likelihood of mechanical damage. As a second but related issue, each active device in the integrated circuit will produce some amount of heat which must be dissipated since elevated temperatures may cause change of the electrical properties of circuit elements on the chip. The amount of heat generally increases as cycle time is reduced and switching frequency increases. Therefore, no more active devices may be included in an integrated circuit than can be accommodated by heat transfer arrangements to maintain chip temperature in an acceptable range. Thus for many circuits for which high performance is of paramount importance, cooling arrangements may be many times the size, weight and cost of the electronic circuits themselves.

On the other hand, in many types of devices, such as dynamic memories and cross-bar switches relatively few active devices will be switching at any given time although the switching frequency or switching speed may remain very high. In other types of devices such as so-called logic macros, including large gate arrays which are specific to a particular logic operation such as a multi-bit (e.g. 64-bit or longer) adder, may have a relatively short duty cycle, on average, and sufficient heat capacity to limit temperature rise even while switching speed or frequency and number of concurrently switching active devices remains high.

Another practical consideration in many devices is process incompatibility between various semiconductor circuit technologies. While numerous so-called hybrid technologies are known (e.g. BiCMos which provides bipolar transistors and field effect transistors of both conductivity types on the same chip) there will often be requirements for devices which cannot be economically formed on the same chip. For this and the above-noted reasons, most complex, high-performance electronic devices will require a plurality of chips to form the complete device.

When plural chips are used, the same types of performance gains may be realized by the packaging employed in order to minimize connection length, signal propagation time, noise immunity and the like to the extent that connection length may be limited. For example, so-called multi-layer modules have been formed by lamination of sheets of polymer or ceramic to provide compact arrangements of complex connections between potentially hundreds of individual chips. However, using such modular packaging, chips are mounted in a generally coplanar manner and worst case wiring length may be up to several inches in some signal paths which, while seemingly short, may be several orders of magnitude longer than wiring on a single chip. Moreover, signal propagation time in large and complex modular devices may be sufficiently great to require plural clock circuits to be provided in the package, usually in a master-slave configuration to maintain adequate synchronization across the package. However, exact synchronization is not assured when plural clocks are provided and criticality of synchronization will increase with switching frequency and reduction of cycle times.

To address wiring length and signal propagation time concerns, it has been proposed to mount chips by stacking and making connections therebetween at the edges of chips. Chips can be mounted on edge on another chip or substrate (hereinafter sometimes referred to collectively as, simply, "substrate") with connections made through circuits formed thereon. However, such an arrangement generally limits connections to a single edge or, at most, two edges of the chip and thus may not provide optimally short signal paths or sufficient connections.

Stacked chips (sometimes referred to as "slave chips") may also be mounted in an orientation substantially parallel to the substrate or chip (sometimes referred to as a master chip). This configuration is particularly appropriate to mounting memory chips on a microprocessor master chip where connections to the chips are largely in parallel.

Such parallel connections, however, are usually formed by bonding of cantilevered connections extending from the edge of each "slave chip" or by wire bonding across the edges of the chips from connection pads on the surfaces thereof. Such connections are not mechanically robust even though difficult and labor-intensive to form. Such stacking arrangements also generally require additional spacers or similar mechanical arrangements to accommodate the connections or wires and the connections are subject to both electrical noise and mechanical damage and do not achieve minimization of signal connection length. Further, any mechanical spacer or the like can serve to concentrate forces on a chip and be a source of mechanical damage thereto during accelerations (e.g. vibration or impact to which the device including the electronic package may be subjected).

Differential thermal expansion between chips must also be accommodated in the stack of chips. This design issue is generally approached by providing good thermal communication between chips of the stack to maintain the entire stack at approximately the same temperature while relying, to some degree on the thermal capacity of each chip and that the amount of heat generated by each chip will be small and distributed between the chips. By the same token, however, heat dissipation of the individual chips is limited by the surface area of the chip stack as well as the thermal resistance between chips. For that reason, substantial forces may still occur within the chip stack, causing stresses in connections and the chips. Repeated thermal cycling may also engender metal fatigue in the connections.

It is also necessary to accommodate circuits which are principally formed on a single major surface of a substrate and stacking thus often requires front-to-front and or back-to-back orientation of adjacent chips even though such orientations complicate parallel connections along the chip edges (e.g. reversing the order of connections from chip to chip unless circuits are symmetrical or can be formed in mirror images) unless solderable connections can be formed on or through the edge of chips.

It should also be appreciated that formation of solderable connection pads on or through the edges of a chip is not trivial, particularly where spacing or feature size must be small to provide a sufficient number of contacts. (For example, chips containing macros or large cross-bar switches cannot generally be stacked since the number of data signal connections and/or control connections is too large.) U.S. Pat. No. 5,266,833 to Capps, for example, while directed to edge-mounting of chips, proposes disposing fine electrical wires in a rectangular grid array within a semiconductor material while the semiconductor crystal is being grown. The crystal is then cut into wafers and diced into chips from the wafer at locations coinciding with the grid array. Such a process would clearly be extremely complex, replete with exacting alignment tolerances, and prohibitively expensive even if good yield could be obtained.

Accordingly, it is seen that while stacking of chips is known, problems encountered in such arrangements have not been adequately solved to provide good manufacturing yield consistent with reliability, performance and economical processes or to extend chip stacking arrangements to additional types of chips such as macros.

SUMMARY OF THE INVENTION

It is therefore an object of the present invention to provide an electronic circuit package structure including stacking of chips to minimize signal connection length and including connection pads made across the edges of chips and extending onto the major surfaces thereof.

It is another object of the invention to provide a mechanically electronic circuit package of increased compactness with improved accommodation of differential thermal expansion between chips in a stack.

It is a further object of the present invention to provide an economical and high-yield method of forming connection pads across the edge of a chip and extending onto the major surfaces thereof.

It is yet another object of the invention to provide an electronic circuit package which provides heat sinking of chips within a chip stack.

It is another further object of the invention to provide a configuration of heat sinking and stacking of slave chips on a master chip supportive of particularly high performance and which is electrically reliable and mechanically robust.

In order to accomplish these and other objects of the invention, an electronic integrated circuit package is provided including a substrate including a bonding pad, and an integrated circuit chip including a metallization feature including metallization deposited on opposing areas on major surfaces of the integrated circuit chip and across an edge of the integrated circuit chip between the opposing areas and bonded to the substrate in an orientation substantially parallel to and spaced from the substrate with a bonding material by a bond between the bonding pad and the metallization feature.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
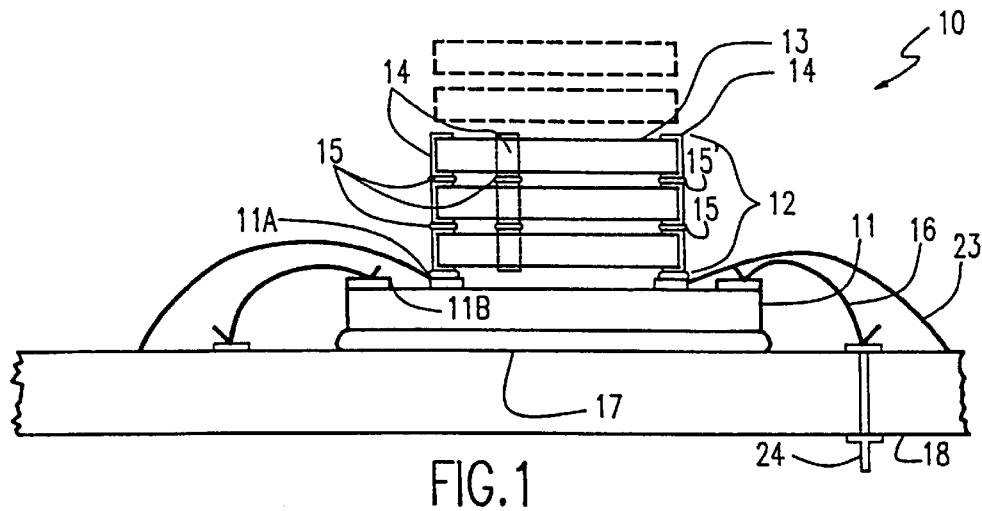
FIG. 1 is a cross-sectional view of an electronic circuit package including a chip stack in accordance with the invention.

Referring now to the drawings, and more particularly to FIG. 1, there is shown, in cross-section, an electronic circuit package 10 in accordance with a preferred form of the invention. Preferably, the package 10 includes a master chip 11, which may be, for example, a microprocessor. Master chips 11 includes metallization features 11a, 11b on a major surface thereof. Metallization features 11b which are preferably near an edge of master chip 11 are provided to allow wire (e.g. 16) bonding to a supporting substrate 18, if provided, in a manner well-known in the art and not important to the practice of the principles of the invention. If used, such a supporting substrate provides for mechanical mounting 17 of the master chip thereto and support of further connection structure such as pins 24.

The nature of the mechanical mounting 17 is not important to the practice of the basic principles of the invention but should generally provide for some damping of relative motion or shock absorbency and provide good thermal conductivity for heat sinking of the master chip 11. Encapsulation 23 of the wire bond connections 16 is also preferably provided when such a supporting substrate is used. Of course, so-called surface mount technology (SMT), so-called flip-chip arrangements or application of the principles of the invention would also be appropriate for making mechanical and electrical connection of the master chip 11 to the supporting substrate 18.

In accordance with the principles of the invention, metallization features 11a on the master chip 11 are formed by any known surface metallization technique within the heat budget of the master chip. Metallization features 11a are connected to circuits of the master chip by any known technique such as the opening of a passivation layer to contact structures of active devices or connections formed within the integrated circuit and depositing conductive material (e.g. metal or doped semiconductor) within the opening by any known technique. Metallization features 11a are thus preferably arranged in registration with as much of the corresponding connections to the integrated circuit as possible consistent with being substantially congruent with the periphery of a stack of slave chips. Alternatively, the layout of master chip 11 may be advantageously adjusted to allow such registration, if desired, or connections formed to any other convenient location on the master chip.

Each of slave chips 13 in chip stack 12 is preferably provided with metallization features 14 which are U-shaped in cross-section extending across an edge and for a limited distance on major (e.g. front and rear/substrate) surfaces of the chip. Of course, the application of such features to a chip or substrate is completely independent of the function, classification or nomenclature of any chip to which the metallization feature 14 may be advantageously applied in accordance with the principles of the invention, as will be discussed in greater detail with reference to FIGS. 13–15. For example, metallization features 15 could also be applied to larger chips corresponding to master chip 11 or a stack thereof, as well as substrate 18 or a stack thereof and so on as a device design may dictate.

Generally it will be convenient to form a plurality of such metallization features 14 on edges of each chip 13 and to provide such features on all sides of each chip in order to allow the exploitation of as much of the full periphery of the chips 13 as possible. However, forming such metallization features on only one or two sides of each chip will also provide certain advantages in particular preferred applications as will be discussed in greater detail below. Chip stack 12 is then formed by bonding of the metallization features on one chip to similar metallization features in registration therewith on another chip with bonding material 15 such as solder or electrically conductive adhesive (ECA).

It should be appreciated that the U-shaped metallization feature 14 is of substantial (but not critical) thickness to provide, together with a thickness of bonding material 15, separation between chips. For this reason, it is preferred that the overall thickness of the metallization feature (including an adhesion layer which need not be thicker than about 100 Angstroms) be at least several tens of thousands of Angstroms, approximately 80,000 Angstroms being a preferred target thickness, such that the total thickness of the two metallization features and the bond between them can be brought to a total thickness of several mils, about four mils thickness being a preferred minimum spacing or gap between chip surfaces when a thermally conductive material and/or heat sink is to be applied between the chips. When flow of air or other cooling fluid is to be circulated between chips, it is preferred that the total thickness of the bond 15 and the metallization features 14 be equal to or greater than chip thickness with greater space being preferable as chip area is increased. A nominal chip thickness and corresponding minimum spacing in this case is about 0.020–0.025 inches 20–25 mils).

While the thickness of the bond 15 is most readily variable, the relative contributions of the metallization features 14 and the bond 15 should be proportioned such that the mechanical and electrical robustness of the bond is not compromised. For example, the bond 15 should not exceed a few mils, depending on the bonding material and the area of the bond or metallization feature 14. Similarly, the thickness of the metallization feature(s) should not be less than approximately the maximum variation from planarity of the surface topography of the chip to which the metallization is applied in order to prevent surface contact between chips should the dimensions of the bond be improperly formed or changed over time. It should be recognized that such thicknesses as are preferred for the practice of the invention are far greater than accepted nominal values for surface metallizations as currently practiced in the art and which are generally less than one mil in thickness.

The space between chips thus obtained can be filled with heat conducting material such as a thermal grease for improved heat conduction between chips and which can, by its viscosity and/or density, additionally provide mechanical support without risk of concentration of forces as would be the case using a substantially rigid spacer adjacent a potentially irregular surface of a chip. Further, a thin metal lamina (e.g. a foil of several mils thickness) can be interposed between chips in the space and preferably extending beyond the chip stack to provide heat sinking as will be discussed in further detail below. Alternately, the space between chips can be exploited for cooling fluid flow, as alluded to above.

In this regard, it should be recognized that the U-shaped configuration of metallization feature 14 also provides registered electrical connections on both sides of the chip. Thus, to the extent that signals may be brought out to the edge of the chip which correspond to connections on other chips, each chip can be oriented at will with respect to adjacent chips. Additionally, the portion of the metallization feature which extends across the edge of the chip provides an area for application of heat to the connection with a probe or radiation source as well as a surface for making a wire bond connection, if desired. It is also possible, if required by the design, to provide a non-conductive bonding material 15' at some locations, as the electrical circuitry of the design may require, to form a mechanical bond without forming an electrical connection.

Figure 2:
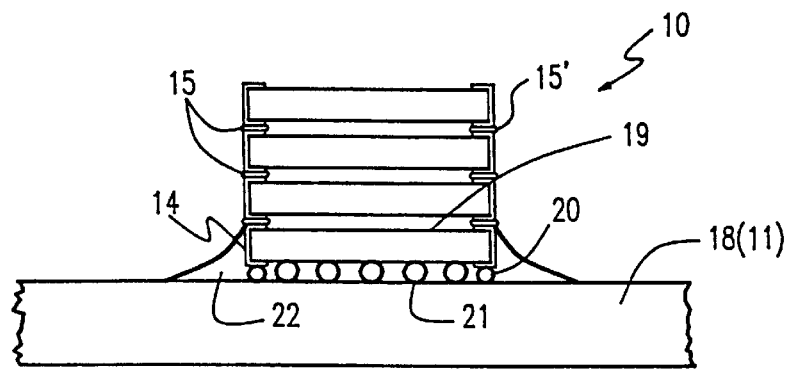
FIG. 2 is a cross-sectional view of an alternative form of electronic circuit package in accordance with the invention.

Referring now to FIG. 2, an alternative form of the invention is shown. The configuration and structure of the chip stack in this alternative embodiment of the invention is identical to that of FIG. 1 and need not be further discussed. This embodiment differs from that of FIG. 1 in the manner in which the chip stack is bonded to substrate 18 or master chip 11, indicated by the reference numeral "18(11)".

Specifically, in this embodiment, the chip stack is bonded to an underlying substrate by so-called "flip-chip" or surface mount technology in which well-known "C4" solder preforms 21 are applied to metal connection pads on either the chip stack or the substrate, the package assembled and the assembly heated to the point that the C4 solder preforms collapse and bond to the registered connection pads on both the chip stack and substrate. In the practice of the invention, the weight of the chip stack may, however, cause excess collapse of the C4 preforms and it is therefore preferred to provide a high temperature spacer 20 to maintain a minimum desired separation between chip 19 and substrate 18(11) and to prevent excess spread of solder from the preforms. Finally, if desired, encapsulation 22 of the bonding structures can be provided and is preferred to increase structural robustness and prevent solder reflow even at high temperatures.

In either of the embodiments of FIGS. 1 or 2, the stack of chips may be formed sequentially or in a single operation. Similarly, the chip stack 12 can be built up from the supporting substrate 18 or master chip 11 or the entire stack can be bonded to supporting substrate 18 or master chip 11 (referred to by reference numeral 18(11)) as if a single flip-chip, as particularly shown in FIG. 2. Whatever sequence of assembly is chosen, solder alloy should be chosen to provide a decrease of melting point temperature at each successive step of assembly. Transient liquid phase techniques in which melting point of the alloy increases as one metal dissolves into another above the melting point of a eutectic alloy can be used to reduce temperature margins in this process as well.

As alluded to above, however, the formation of metallization features 14, particularly in a U-shaped form and at small feature size or in close proximity, is not trivial and the provision of suitable structures for manufacture of the above-described structure is an important aspect of the present invention. While the invention could be practiced using only surface metallization features, some difficulties of registration and alignment for dicing of the chips or even adhesion of the metal to the chip as the wafers are diced may compromise manufacturing yield even though metallization on major surfaces of a chip is a well-developed process. The technique of forming the U-shaped metallization in accordance with the present invention is common to U.S. patent application Ser. No. 08/785,195 (IBM docket EN9-96-077), concurrently filed by the present inventors, assigned to the assignee of the present invention and which is fully incorporated by reference.

Figures 3, 3A, 4:
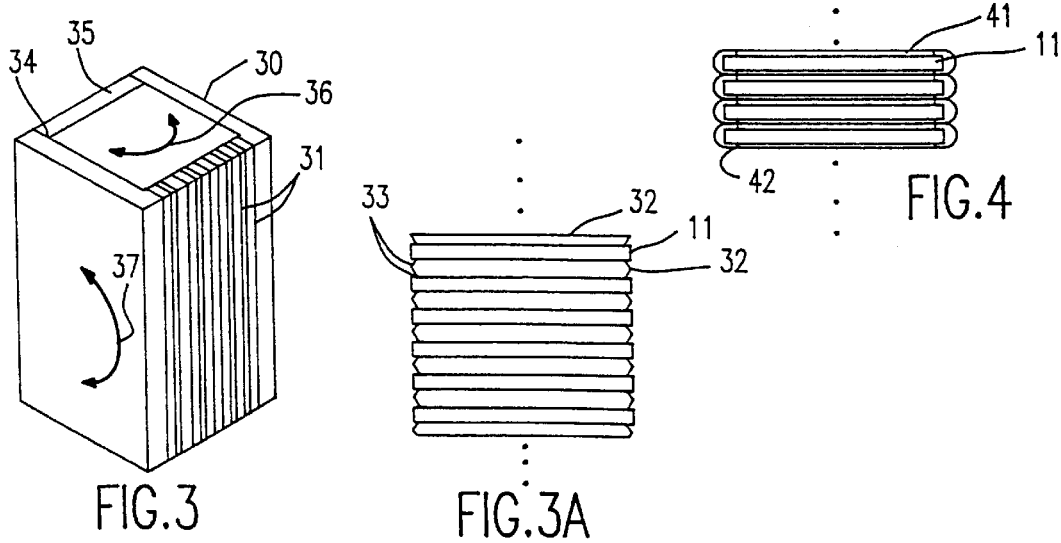
FIG. 3 illustrates use of a comb mask for performing edge metallization of chips in accordance with a preferred method of practicing the invention.
FIG. 3a shows stacking of chips and spacers for edge metallization of chips using a comb mask.
FIG. 4 illustrates use of a radiation sensitive mask for performing edge metallization in accordance with a variant method of practicing the invention, FIG. 5 in a detailed plan view of the metallization pattern developed in the manner discussed in connection with FIGS. 3 and 3a, FIGS. 6, 7 and 8 are, respectively, end, plan and side views of an alternative structure for achieving chip edge metallization such as is illustrated in FIG. 5.

The reason for difficulty of edge metallization is largely due to difficulties of handling of chips and definition (e.g. masking or exposure) of discrete areas on extremely narrow surfaces of individual chips. In contrast, metallization on major surfaces is usually done on a wafer prior to dicing the wafer into chips (which forms the edges where metallization is desired). Moreover, common methods of handling and positioning of chips for processing generally involves contact with and across the substrate side of the chip which may limit access to the chip edges and prevents processing of the surface of the chip by which it is held or manipulated. Therefore, using conventional metallization processes, even if appropriate to edge metallization, would at least require separate metal deposition steps and careful alignment of the chips between deposition steps in order to cause metallization to extend onto both major surfaces of the chip. In summary, the scope of difficulties in processing chip edges may perhaps be best appreciated by considering that most lithographic and other processes involved in semiconductor manufacture involve a generally planar area whereas development of a metallization feature on a chip edge and extending onto both major surfaces of the chip requires processing of a three-dimensional object including simultaneous processing from two substantially opposing directions and a third direction substantially orthogonal thereto To solve these problems with conventional metallization processes, in accordance with the invention, the individual chips are enclosed in a mask as opposed to forming a mask only on a major surface thereof. A preferred form of such a mask is illustrated in FIG. 3 and is in the form of a tube 30 which is shaped and sized such that the inside dimensions closely follow the perimeter of the chips to be processed. A removable panel 35 is preferably provided by forming slits 34 to facilitate cleaning and insertion of chips and to allow dimensional adjustment to firmly engage the inserted chips. The use of such a tube configuration allows the processing of a plurality of chips to be simultaneously carried out to develop metallization features 14. A mask can be formed in one side and the chips rotated for metallization on plural sides or plural masks can be provided on opposing sides of the chips for simultaneous metal deposition on two sides (in which case the removable panel 35 should be on yet another side of the chips).

Incidentally, since metallization for edge mounting may be appropriate only on less than all sides (e.g. generally two opposing sides) of the chip, it may be convenient to dice the wafers into strips of chips 62 in only one direction for this process in order to increase the number of chips which can be simultaneously processed and to ease chip handling requirements. However, uniformity between chips at different locations in each strip would not be guaranteed but may, nevertheless, be within the processing tolerances of the design. For example, an array of 3 mil wide metallized areas has been successfully formed on glass at a spacing of 5 mils over an extent of four inches with a regularity of spacing (with variation in dimensions and spacing much less than 1 mil) which is projected to be sufficient for application to current high density integrated circuit designs.

The tube mask 30 is preferably of metal or glass which has grooves 31 machined into one or more sides thereof, as may be desired or required by the package design. Preferably, for silicon chips, a molybdenum mask is used since it has a similar coefficient of thermal expansion to silicon. Extremely fine grooves at close spacing are preferably provided over most of the length of tube 31 by electron discharge machining (EDM) which is well-understood in the art. Thus, the grooves divide the material of the tube into a generally comb-like pattern or shape. However, depending on the tube thickness and material, it may be preferred to terminate the grooves short of both ends of the tube so that the remaining material is not cantilevered but supported at both ends of the tube 30 to maintain accurate spacing between strips of remaining material. Other techniques such as lithography (e.g. etching) and laser ablation can also be used to form similar grooves in a tube or sheet, as shown in FIGS. 6–8.

Figure 6:
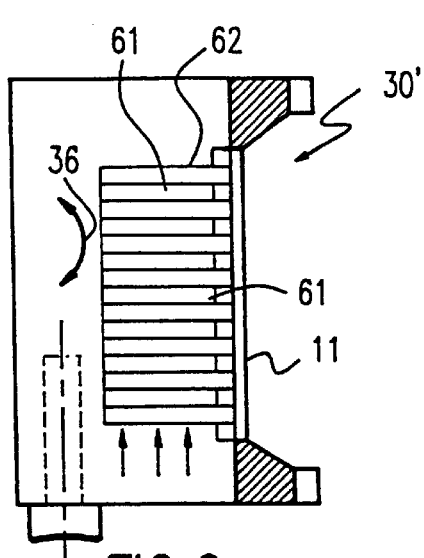
Figure 7:
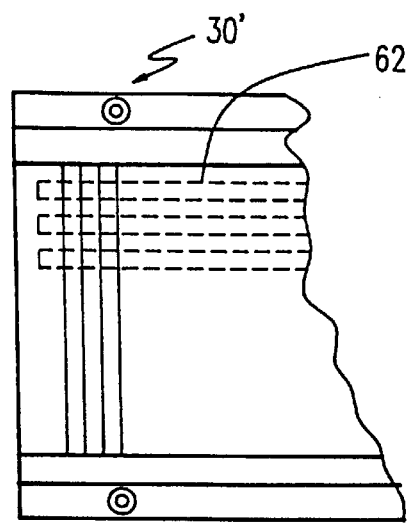
Figure 8:
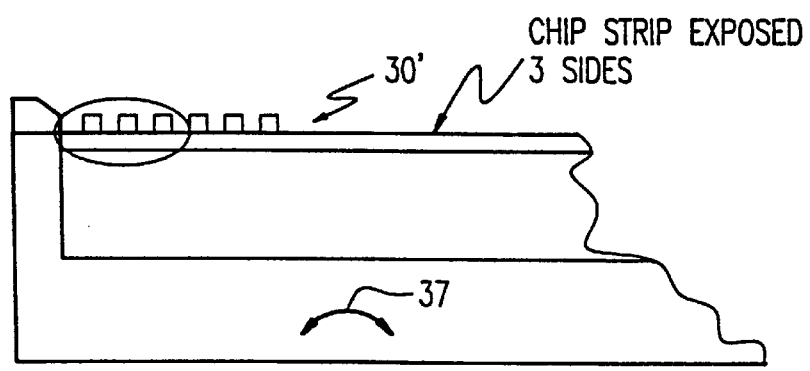
Figure 5:
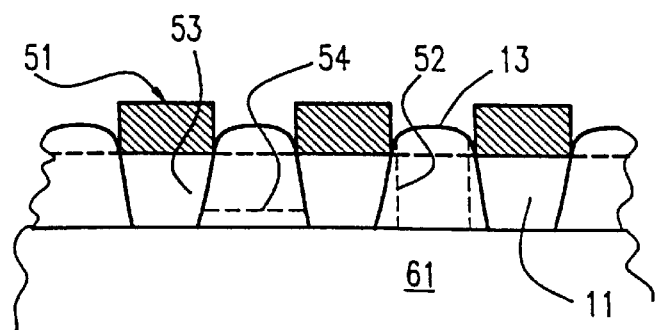

Alternatively, an array of parallel fine wires can be provided as a mask in much the same manner as depicted in FIGS. 6–8 (which is intended as generic thereto) and held in place by tension adjacent a stack of chips. (For fine features, the wires should have a flat side which can be held against the chip edges.) However, in such a case, a holding arrangement for the chips and enclosure of the remainder of the chip surface must be separately provided. Further, it is considered preferable that the material between open spaces of the mask be of rectangular or trapezoidal cross-section, as shown in FIG. 5.

One or more chips 11 are inserted into or placed adjacent the mask and the individual chips are enclosed by spacers 32 which are bevelled at the locations of the grooves 31 in the comb mask 30 to expose portions of the major surfaces of the chip contiguous to the chip edge, as shown at 33 of FIG. 3a. Bevelling is preferred since it can be readily accomplished and provides both accurate positioning of the spacers without other salient features which bear against the tube mask 30 and regulated exposure of portions of the perimeter of the chips. Similar spacers are preferably placed at the ends of a stack including one or more chips in order to enclose all chips in the stack.

Alternatively, as shown in FIGS. 6–8 the bevelled portions of the spacers can be omitted and blocking masks 61 may be placed to define the desired extent of metallization contiguous to the chip edge and held in place by a clamping arrangement, best illustrated in FIG. 6, which provides compressional forces across the stack of chip or strips of chips 62 and spacers/blocking masks and a compressional force of the grooved mask against the edges of the chips 11 or strips of chips 62.

Once chips are suitably enclosed within the comb mask tube 30 or the mask arrangement 30' shown in FIGS. 6–8, metallization may be directly performed by inserting the mask arrangement 30 or 30' in a metal deposition chamber and proceeding with sputtering or evaporation by known processes. Advantageously, the mask arrangement containing the chips is rotated in an oscillatory fashion in two directions indicated by arrows 36 and 37 of FIG. 3. Direction 36 achieves substantial uniformity of deposition in metallization features over the length of each edge of each respective chip in view of the effective collimation provided by the mask. Direction 37 achieves substantial uniformity of metallization over the number of chips in the stack and within each metallization feature as it wraps around two corners to the major surfaces of each chip.

Specifically, FIG. 5 (taken in the same direction as the view of FIG. 8) shows the relationship of portions 51 the mask to the edges of blocking mask 61 and the edge of chip 11 and the deposit of metal achieved in accordance with the mask arrangements 30 or 30' in a metal evaporation or sputtering apparatus. The metal deposits are slightly trapezoidal in plan view due to motion 37 and will be tapered at the edges although a rectangular region indicated by dashed line 52 will be of substantially uniform thickness approximating that of the thickness of the deposit on the chip edge. Some decrease of thickness with increasing distance from the chip edge and toward the edge of blocking mask 61 may occur, depending on the angular extent and speed of motion 37 through that angle.

It should also be understood that while dry metal deposition processes including but not limited to sputtering and evaporation are preferred for direct deposit of metal using mask arrangements 30 or 30' since the mask need not hermetically enclose the chip on areas which are not intended to receive metallization, other metal deposition techniques such as seeding and electroless deposition can be used. It is preferred to provide an adhesion layer of, for example, chromium followed by a layer of a highly conductive layer such as copper. Multi-layer composite structures can be used for either the adhesion or the highly conductive layers or both. Alloys or mixtures of such metals such as a mixture of chromium and copper can also be used to obtain high conductivity and high adhesion, particularly in combination with dry deposition and heat treatment. One or more barrier layers of, for example, a noble metal such as gold can be applied over the highly conductive metal layer, if desired.

As a perfecting feature of the invention, it is preferred that the metal used for the adhesion layer not be solder-wettable (e.g. such as chromium) and that during application of the adhesion layer, the angular motion at least in direction 37 be slightly greater than the angular motion used during deposition of the high conductivity metal layer. Thus, the adhesion layer can be made to extend very slightly beyond the solder-wettable metal used for the conduction layer, as depicted by dashed lines 53 in FIG. 5 and will thus serve to limit solder flow laterally toward another metallization feature at locations where the metallizations are more proximate to each other due to their slightly trapezoidal shape.

As alluded to above, when a liquid is brought into contact with the substrate edges during the chosen metal deposition process, it is preferred to provide more hermetic masking than may be reliably available from the mechanical masks used in the manner described above. While the masking arrangements discussed above in regard to FIG. 3 and FIGS. 6–8 are effective to provide desired patterned deposition in the manner preferred for the practice of the invention, regardless of metal deposition methodology, liquid-tightness is not assured. During dry metal deposition techniques, the directionality of metal particles (as indicated, for example, in FIG. 8) can be exploited to allow use of such mechanical mask arrangements. Such directionality, unfortunately, is not available when metal is deposited from liquid solution. In such cases, it is preferred to use a lithographic resist to avoid liquid contact with the chips other than areas on which metal is to be deposited, as will be discussed in connection with FIG. 4.

In FIG. 4, a stack of chips 11 or strip of chips 62 is shown after each chip has been fully coated with resist 41. It is assumed that these chips are held in such a stack by a clamping arrangement for compressing the stack together but which is otherwise unimportant to the practice of the invention. This stack of chips 11 or strips of chips 62 is similar to those accommodated in the mechanical masks described above, except that spacers 31 or blocking masks 61 need not be employed. If such spacers or blocking masks are employed, it is only necessary to coat the edges and major surfaces of the chips 11 or strips of chips 62 to the extent that they extend beyond the edge of spacers 32 or blocking mask 61 and that the stack remain clamped together during the exposure, development and metallization process.

Exposure of the resist may be done at any wavelength suitable to the resist and the type of resist is not important to the practice of the invention. For purposes of this discussion and correlation with the above description of direct metallization, a positive resist is assumed but a negative resist could be used if a "negative" exposure is employed. The resist may be exposed with known lithographic exposure tools using a translation table permitting exact relative movement between the exposure radiation source and the stack of chips or a mask with collimated (and preferably short wavelength radiation). Alternatively, the stack of chips may be exposed using mechanical masks such as those described above for direct metallization. Specifically, using such masks, exposure of the resist can be carried out in the same manner as that described above for dry metal deposition (since the exposing radiation is similarly directional) except that rotational movement of the mask to assure uniform thickness of metal deposition is not required during resist exposure, particularly if the exposing radiation is collimated.

As is known, lithographic exposure radiation will be scattered for some depth within the resist and, to the extent that "blooming" of the exposure area can be sufficiently avoided, overexposure to a depth past the edges of the chips 11, as indicated at 42 of FIG. 4 is desirable. Alternatively, since development of the resist proceeds from the surface of the resist, overdevelopment (or a combination of overexposure and overdevelopment) can be used to the same effect. It should be also understood that once exposure has been accomplished, individual chips 11 or individual strips of chips 61 may be developed and metallized singly or in lesser numbers than present in the stack, particularly if resist is applied over the entirety of each chip. However, in general, no particular advantage is to be gained thereby while it is undesirable for resist-developing solutions to come into contact with chips since it presents the possibility for damage thereto. Such contact will be prevented simply by maintaining a compressive clamping force on the stack during resist development.

Once the resist has been developed to expose areas of each chip on which metallization is desired, metallization can be carried out even without removing the chip stack from the mask arrangement. In this regard, an adhesion layer can be advantageously employed as described above. Further, the non-solder-wettable adhesion layer metal can be made to extend beyond the solder-wettable conduction layer to limit solder flow, as described above, either by the use, in sequence, of two resist masks having slightly different opening sizes, dry depositing the adhesion layer before resist masking or depositing non-solder wettable material on the edge of the resist within the openings such that the non-solder-wettable material 54 will remain adhered to the conductive metal layer when the resist is removed. This latter variant can be accomplished, for example, by electrolessly plating nickel on the resist and exposed chip or substrate followed by electroless deposition of copper. Then after the conductive metal is deposited and the resist removed, a block-out mask could be applied over the metal of the highly conductive layer and the nickel oxidized to form a non-solder-wettable barrier to solder flow. Seeding of the resist may allow the use of other adhesion layer materials, as well. When the metallization is complete, the resist mask can be stripped and the stack can be dissembled (and further diced, if necessary) into individual chips to be assembled into package configurations as discussed above in connection with FIGS. 1 and 2.

In view of the foregoing, it is seen that the invention provides an electronic circuit package having improved robustness and which can be manufactured or reworked by a variety of economical and high-yield processes. The metallization feature supporting this novel structure and the processes for its production can also be formed reliably and economically by a variety of processes and utilizing a variety of tools as a mechanical mask either for direct metallization or exposure for patterning of a resist mask to define the metallization features.

Having described the formation of an electronic circuit package in accordance with the basic principles of the invention, some perfecting features which may be exploited to advantage in some applications will now be discussed. Specifically, as alluded to above, the thickness of metallization features 14 in combination with the thickness of bonding material 15 provides a "stand-off" between chips which accommodates variation in topology of the chips and allows thermally conductive material and/or heat sink structure to be placed in spaces thus formed between chips, if desired or required by a particular package design.

Figure 9:
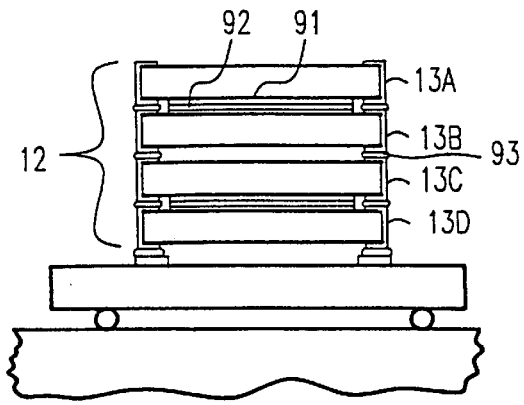
FIGS. 9 and 10 are orthogonal cross-sectional views of a circuit package including heat sinks within a chip stack in accordance with the invention.

In FIG. 9, the chip stack structure 12 is identical to that of FIGS. 1 or 2. However, while not evident from FIG. 9, the substrate sides of chips 13a and 13b (and also 13c and 13d) are oriented to face each other for improved regularity of chip surfaces facing the heat sink. A thermal grease 91 and a thin metal sheet 92 are preferably provided between pairs of chips (e.g. 13a, 13b and 13c, 13d) while only a thermal grease is applied in the space 93 between chips 13b and 13c or the space left open for flow or air or other cooling fluid.

Figure 10:
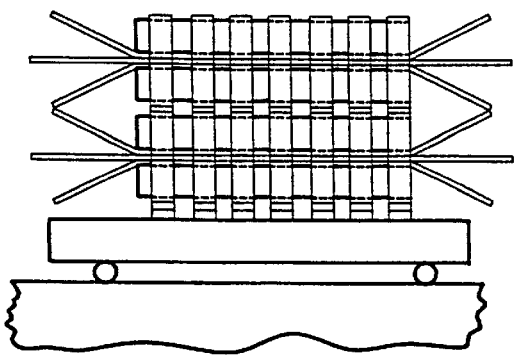

No direct attachment of the metal sheet heat sinks is required since the ends of the heat sink sheets are preferably slitted and the ends bent slightly as shown in the side view of the assembly of FIG. 10. The bending of the ends of the heat sink sheets 92 retains them between the chips and also improves heat transfer efficiency to surrounding air or other cooling fluid.

Figure 12:
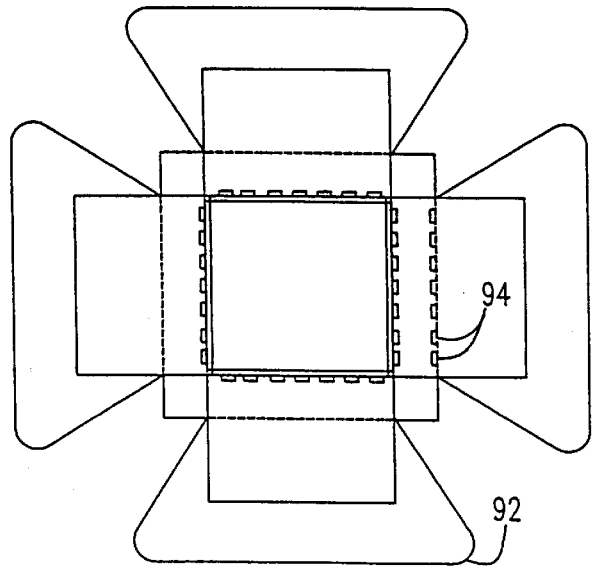
FIGS. 11 and 12 are side and plan views of a circuit package including a master chip with attached heat sink and plural stacks of slave chips having heat sinks included therein in accordance with a preferred application of the invention.
Figure 11:
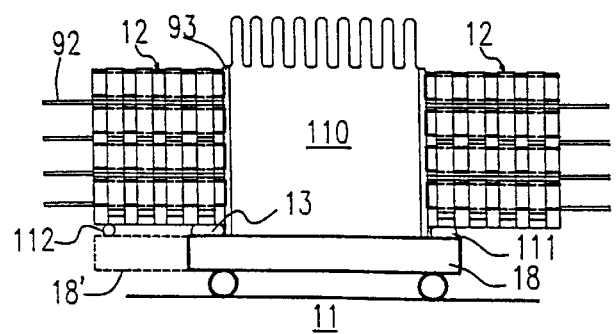

FIGS. 11 and 12 show the application of the above-described features of the invention to a particular complex, high performance circuit package. Specifically, it was noted above that chips, such as a microprocessor, which have many active elements switching simultaneously at high frequency can be expected to generate substantial amounts of heat while chips having fewer elements simultaneously switched (as in a dynamic memory) or which are exercised at lower average duty cycles (as in a logic macro or cross-bar switch) can be expected to generate correspondingly less heat. The package illustrated in FIGS. 11 and 12 is exemplary of configurations which accommodate these differing requirements for heat dissipation while maintaining extremely short signal paths in such a combination of chips by application of the principles of the invention.

Specifically, master chip 18 which may correspond to a microprocessor is bonded to a substrate 11 in the manner depicted in FIG. 2 although the arrangement shown in FIG. 1 would be suitable, as well. Since master chip 18 is expected to generate substantial heat, a large heat sink 110 may be mounted centrally thereof, as depicted. Stacks of slave chips may be mounted on the margins of master chip 18 (or a larger chip used as indicated at 18') by bonding 111 of metallization features 13 (and additional surface metallization features 94 if necessary to obtain a sufficient number of connections) to surface metallization on the master chip 18 as described above. The side of the chip stacks 12 are also preferably bonded to the sides of the heat sink 110 using an electrically insulative but thermally conductive adhesive 93 which also bonds to an end of the heat sink sheets 92. The other end (and sides if connections using metallization features 14 are not required on the sides or heat sink material brought out therebetween, as shown in the plan view of FIG. 12) of the heat sink sheets 92 is extended in much the same manner as is shown in FIG. 10. Thus, heat sink 110 can remove heat from the chip stacks and/or serve to regulate the temperature of the entire package. Further, heat sink sheets 92 can supplement the removal of heat from the master chip 18. The apparent cantilever of the chip stacks 12 does not compromise the mechanical robustness of the package since the mechanical bond 93 extends over and area comparable to the area which would otherwise be provided on master chip 18 for mounting of the chip stack. Additional robustness and space for additional contacts could be provided by extending the size of the master chip 18 as indicated at 18' but the cost of wafer space of the larger chip and the marginal further increase in mechanical integrity is not considered to justify such a structure absent a need for additional electrical connections 112.

Figure 13:
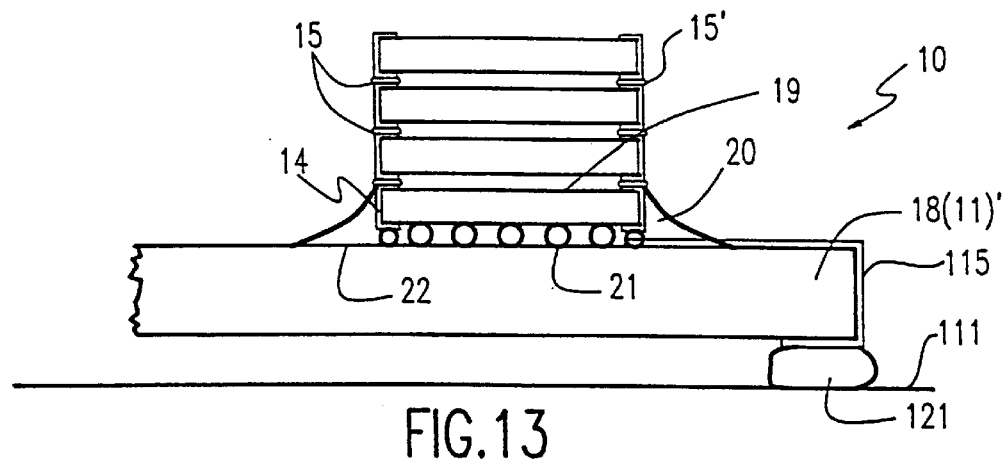
FIGS. 13, 14 and 15 are cross-sectional views of variant embodiments depicting various perfecting features of an electronic device package in accordance with the invention.

In the variant embodiment of FIG. 13, edge metallization 115 is also provided on master chip or substrate 18(11) in the same manner as in the stack 12 of slave chips, as described above, which may be bonded thereto as described above with reference to FIG. 2 Therefore, it should be understood that more than one chip stack 12 can be supported by the master chip or substrate 18(11) as described above with reference to FIGS. 11 and 12, Further, it should be recognized that plural master chips or substrates 18(11)' having edge metallization features 115 can be stacked together with or without provision for thermal materials, heat sinks and/or cooling fluid flow therebetween in the same manner as the slave chip stack structure described above with reference to FIG. 1. Moreover, these type of variations of the invention may be repeated at will in package designs for any number of substrates in any number of stacks or hierarchies thereof in a pyramidal fashion which may extend either laterally (e.g. increasing the number of stacks attached to a particular master chip or substrate), vertically (e.g. the number of chips or substrates of a particular size which may be stacked), or hierarchically (e.g. the number of different sizes of chips or substrates which may be bonded or otherwise connected in the manner of the connections of the slave chip stack to the master chip 11 or master chip stack and, in turn, to chip or substrate 11 which may also be stacked and connected to a further chip, substrate, board or panel 111 and so on).

Figure 14:
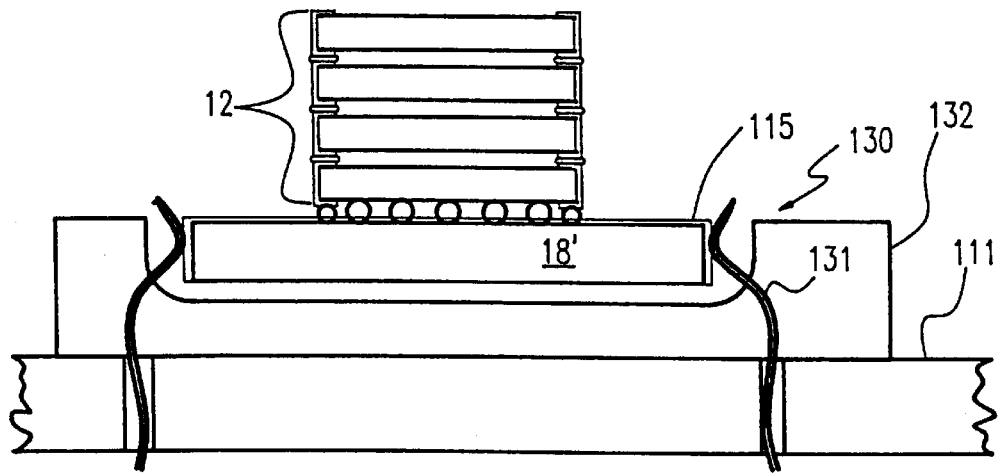
Figure 15:
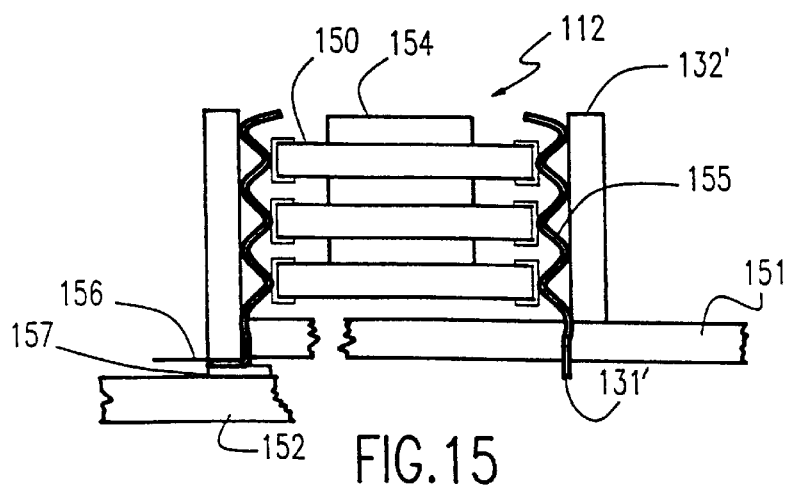

While SMT bonding utilizing a C4 preform or electrically conductive adhesive in a manner similar to that discussed above in connection with FIG. 2 is provided between the master chip or substrate 18(11) and panel 121 as illustrated at 121 of FIG. 13, it should be recognized that wire bonding similar to that illustrated in FIG. 1 or other connection techniques can be used at any level of the hierarchy. For example, as illustrated in FIG. 14, a so-called zero insertion force (ZIF) connector 130 can be employed on panel 111 for connection to master chip 18 or any other chip or substrate having edge metallization 115. Such a ZIF connector preferably comprises one or more resilient conductive members 131 which are preferably arranged to be slightly deflected by the insertion of a chip or substrate 18' therebetween and thus apply opposing forces against opposing edges of the chip or substrate. The ZIF connector also preferably includes a housing or lateral enclosure 132 which is preferably dimensioned to ensure registration of members 131 with edge metallization features 115 and to prevent deflection of members 131 beyond their limit of elastic strain in order to prevent permanent deformation thereof if deflected by accelerations of the package. Alternatively, if members 131 are not provided on all sides of the chip or substrate 18' a portion of housing or enclosure 132 may provide a force on the chip or substrate 18' opposing those applied by member or members 131 on other sides of the chip or substrate 18'.

It should be appreciated that the hierarchy of chip or substrate 18' having one or more chip stacks 12 bonded (or connected by another, similar ZIF connector) thereto may include other structures such as heat sinks or other cooling arrangements. Thus the configuration illustrated in FIG. 14 is particularly appropriate to provision of a pluggable high-performance microprocessor package such as that described above in connection with FIGS. 11 and 12.

In the same manner as discussed in connection with reference to FIG. 13, the principles of the invention discussed with reference to FIG. 14 can be applied to a stack 112 of chips or substrates or stacks thereof 150 which may or may not be bonded together and to one, two or more panels such as 151, 152. Specifically, it should be understood that each depicted chip or stack of chips 150 could be a single chip, a stack of chips of the same size such as stack 12 of FIG. 1 or a combination of a slave chip stack with one or more (e.g. stacked and bonded or otherwise connected) master chips or a larger hierarchy thereof. That is either or both of depicted elements 150, 154 could contain a stack of chips. In any case where such a chip or such stack or hierarchy of chips is not bonded to the adjacent chip or such stack or hierarchy of chips and/or substrates, a heat sink or spacer 154 should generally be provided. Of course, heat sinks or other heat dissipation arrangements can be included within any bonded or otherwise connected stack or hierarchy of chips or substrates.

Connections 131' to chips or substrates or stacks and/or hierarchies thereof 150 is preferably made, in this embodiment, by serpentine contact wires 155 which may, if desired have their conductivity enhanced and contact resistance reduced by gold plating or the like. These contact wires 155 may be mounted in blind or through apertures in a chip, substrate or panel (e.g. 151) or surface mounted to a chip, substrate or panel (e.g. 152) as indicated at 156, 157. The preferred serpentine form of connection wire 155 is supported along its length at spaced locations by supports 132' which effectively perform the functions of respective portions of housing 132 in FIG. 14. Since chips, substrates or panels 151, 152 need not be the same element or even directly physically connected and supports 132' can be mounted on any desired structure, the arrangement can be used in connecting separate chips or stacks of chips as part of the electronic circuit package design.

In view of the foregoing, a mechanically robust and electrically reliable high performance circuit package has been provided utilizing the principles of the invention in an application such as a microprocessor in combination with a large dynamic memory and logic macros and the like. Of course, the number of slave chip stacks could be readily increased beyond the four shown in FIG. 12 by providing a polygonal master chip 18 or in the further corners of extended master chip 18' or any combination of the two approaches. The entire configuration of FIG. 12 could be repeated and joined at heat sinks 92 and/or electrically connected at master chip 18, substrate 11, sides or ends of chip stacks 12 or elsewhere, if desired, to increase the number of electronic devices which may be included. It should also be understood that any number of the packages of FIGS. 11 and 12 could be similarly provided on the opposite side of substrate 11, as well.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. An electronic integrated circuit package including
   a substrate including a bonding pad, and
   an integrated circuit chip including a metallization feature including metallization deposited on opposing areas on major surfaces of said integrated circuit chip and across an edge of said integrated circuit chip between said opposing areas and bonded to said substrate in an orientation substantially parallel to said substrate with a bonding material by a bond between said bonding pad and said metallization feature.

2. An integrated circuit package as recited in claim 1, further including
   another integrated circuit chip including a metallization feature including metallization on opposing areas on major surfaces of said integrated circuit chip and across an edge of said another integrated circuit chip between said opposing areas and bonded to said integrated circuit chip in an orientation substantially parallel to said substrate with a bonding material to said substrate by a bond between said respective metallization feature so said integrated circuit chip and said another integrated circuit chip.

3. An integrated circuit package as recited in claim 2, wherein a thickness of said metallization feature on said integrated circuit chip, a thickness of said metallization feature on said another integrated circuit chip and a thickness of said bonding material provides a space between said integrated circuit chip and said another integrated circuit chip.

4. An integrated circuit package as recited in claim 3, wherein said integrated circuit chip and said another integrated circuit chip each have a substrate and are mutually oriented such that said substrate of said integrated circuit chip and said substrate of said another integrated circuit chip face each other across said space.

5. An integrated circuit package as recited in claim 3, further including
a thermally conductive viscous material disposed in said space.

6. An integrated circuit package as recited in claim 3, further including
a heat sink partially disposed in and extending from said space.

7. An integrated circuit package as recited in claim 5, further including
a heat sink partially disposed in and extending from said space.

8. An integrated circuit package as recited in claim 4, further including
a heat sink partially disposed in and extending from said space.

9. An integrated circuit package as recited in claim 8, further including
a viscous material disposed in said space.

10. An integrated circuit package as recited in claim 1, further including
wire bonding of said substrate to a further supporting substrate.

11. An integrated circuit package as recited in claim 1, further including
surface mount bonding of said substrate to a further supporting substrate.

12. An integrated circuit package as recited in claim 1, further including
a heat sink attached to said substrate.

13. An integrated circuit package as recited in claim 12, further including
a mechanical bond between said heat sink and said integrated circuit chip.

14. An integrated circuit package as recited in claim 2, further including
a heat sink attached to said substrate.

15. An integrated circuit package as recited in claim 14, further including
a mechanical bond between said heat sink and assembly of said integrated circuit chip and said another integrated circuit chip.

16. An integrated circuit package as recited in claim 4, further including
a heat sink attached to said substrate.

17. An integrated circuit package as recited in claim 16, further including
a mechanical bond between said heat sink and assembly of said integrated circuit chip, said another integrated circuit chip and said heat sink having a portion disposed in said space.

18. An electronic circuit package as recited in claim 1, wherein said substrate includes a metallization feature including metallization deposited on opposing areas on major surfaces of said substrate and across an edge of said substrate between said opposing areas.

19. An electronic circuit package as recited in claim 2, wherein said substrate includes a metallization feature including metallization deposited on opposing areas on major surfaces of said substrate and across an edge of said substrate between said opposing areas.

* * * * *